(12) United States Patent
Zur et al.

(10) Patent No.: US 11,280,749 B1
(45) Date of Patent: Mar. 22, 2022

(54) HOLES TILT ANGLE MEASUREMENT USING FIB DIAGONAL CUT

(71) Applicant: APPLIED MATERIALS ISRAEL LTD., Rehovot (IL)

(72) Inventors: Yehuda Zur, Tel-Aviv (IL); Alexander Mairov, Herzlyiah (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 17/079,297

(22) Filed: Oct. 23, 2020

(51) Int. Cl.
```
G01N 23/2251    (2018.01)
H01J 37/305     (2006.01)
H01J 37/20      (2006.01)
H01J 37/28      (2006.01)
H01J 37/30      (2006.01)
```

(52) U.S. Cl.
CPC .......... *G01N 23/2251* (2013.01); *H01J 37/20* (2013.01); *H01J 37/28* (2013.01); *H01J 37/3005* (2013.01); *H01J 37/3053* (2013.01); *G01N 2223/07* (2013.01); *G01N 2223/418* (2013.01); *G01N 2223/507* (2013.01); *G01N 2223/6116* (2013.01); *H01J 2237/221* (2013.01); *H01J 2237/24578* (2013.01);
(Continued)

(58) Field of Classification Search
CPC .......... G01N 23/2251; G01N 2223/07; G01N 2223/418; G01N 2223/507; G01N 2223/6116; H01J 37/20; H01J 37/28; H01J 37/3005; H01J 37/3053; H01J 2237/221; H01J 2237/24578; H01J 2237/2814; H01J 2237/2817; H01J 2237/31749

See application file for complete search history.

(56) References Cited

U.S. PATENT DOCUMENTS 5,384,463 A * 1/1995 Honjo ................ G03F 1/86
                                           250/396 R
6,670,610 B2   12/2003 Shemesh et al.
(Continued)

FOREIGN PATENT DOCUMENTS

JP    2010005773 A    1/2010
KR    20130065210 A   6/2013

OTHER PUBLICATIONS

PCT/US2021/051320, "International Search Report and Written Opinion", dated Jan. 11, 2022, 12 pages.

*Primary Examiner* — David A Vanore
(74) *Attorney, Agent, or Firm* — Kilpatrick Townsend & Stockton LLP

(57) ABSTRACT

A method of evaluating a region of a sample that includes a plurality of holes, wherein the method includes: taking a first image of the region by scanning the region with a first charged particle beam; evaluating the first image to determine a first center-to-center distance between first and second holes in the plurality of holes; milling a diagonal cut in an area within the region that includes the second hole at an angle such that an upper surface of the sample in the milled area where the second hole is located is recessed with respect to an upper surface of the sample where the first hole is located; thereafter, taking a second image of the region by scanning the region with the first charged particle beam; evaluating the second image to determine a second center-to-center distance between first and second holes in the plurality of holes; and comparing the second center-to-center distance to the first center-to-center distance.

20 Claims, 7 Drawing Sheets

(52) U.S. Cl.
CPC .......... *H01J 2237/2814* (2013.01); *H01J 2237/2817* (2013.01); *H01J 2237/31749* (2013.01)

(56) References Cited

U.S. PATENT DOCUMENTS

| | | | | |
|---|---|---|---|---|
| 6,768,324 | B1* | 7/2004 | Yamada | G01R 31/307 324/754.22 |
| 7,473,911 | B2* | 1/2009 | Kadyshevitch | H01J 37/32935 250/492.22 |
| 7,847,267 | B2* | 12/2010 | Shemesh | H01J 37/28 250/397 |
| 8,709,269 | B2 | 4/2014 | Shemesh | |
| 9,046,475 | B2 | 6/2015 | Langer et al. | |
| 10,903,044 | B1* | 1/2021 | Litman | H01L 27/11556 |
| 2003/0184332 | A1* | 10/2003 | Tomimatsu | G01R 31/2886 324/750.22 |
| 2006/0245636 | A1* | 11/2006 | Kitamura | G06K 9/036 382/149 |
| 2016/0204041 | A1 | 7/2016 | Kim et al. | |
| 2018/0012349 | A1* | 1/2018 | Sakai | H01J 37/22 |
| 2019/0198404 | A1 | 6/2019 | Kim et al. | |
| 2020/0173772 | A1 | 6/2020 | Subrahmanyan | |
| 2020/0384592 | A1* | 12/2020 | Zur | B23Q 15/22 |
| 2021/0036142 | A1* | 2/2021 | Davidescu | H01L 21/3065 |
| 2021/0080412 | A1* | 3/2021 | Moeller | H01J 37/28 |
| 2021/0082664 | A1* | 3/2021 | Zur | H01J 37/3056 |
| 2021/0335571 | A1* | 10/2021 | Blayvas | G01N 1/32 |

* cited by examiner

HOLES TILT ANGLE MEASUREMENT USING FIB DIAGONAL CUT

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen such as a silicon, gallium nitride or other type of wafer that includes one or more integrated circuits (ICs) or other electronic structures formed thereon can be milled and analyzed with a focused ion beam (FIB) and/or with a scanning electron microscope (SEM) to study specific characteristics of the circuits or other structures formed on the wafer.

One characteristic of structures formed on a wafer that can lead to defects is a hole that is etched at angle rather than vertically as might have been intended. For example, in a deep hole, such as a via for a VNAND device, even a slight unintended angle can result in a defective device. To illustrate, reference is made to FIG. 1, which is a simplified cross-sectional view of a partially formed semiconductor device 100 formed on a substrate 110. As shown in FIG. 1, substrate 110 can have multiple alternating layers formed over it, such as layers 120 and 130. A deep hole 140 can be etched through the layers to a feature 150. As an example, the hole 140 can be a via filled with a metal or conductive material that provides an electrical connection to feature 150. If, when hole 140 is etched, the hole is etched at a slightly tilted angle (e.g., angle α) such that a hole 160 is formed instead of hole 140, the hole 160 may not contact feature 150 and any circuit that was intended to have an electrical path between via 140 and feature 150 might be defective.

Additionally, FIG. 1A is just a cross-section of substrate 110 and thus only shows the sample (semiconductor device 100) along two axis (e.g., the X and Z axis). The angle that hole 160 is etched can be misaligned from an ideal vertical hole in either or both of the X and the Y axis. FIG. 1B is a simplified illustration of a surface 170 of substrate 110 at which features 150 are formed. As shown in FIG. 1B, hole 160 can be misaligned (as compared to the intended via 140) with structure 150 in both the X and the Y directions. In some applications, given the depth of features 150 below an upper surface of the sample, etching a tilted hole 160 as little as one degree off can result the hole being misaligned with feature 150 or to other structures within substrate 110 by an undesirable distance.

It can be difficult to accurately detect tilted angle holes formed in a structure such as semiconductor device 100. Accordingly, improvements in detecting tilted holes are desirable.

BRIEF SUMMARY OF THE INVENTION

Embodiments of the disclosure provide methods and a system for detecting tilted holes formed in a sample, such as a semiconductor wafer. Embodiments can evaluate a sample, that includes two or more holes etched into the sample and determine whether the holes are formed at a tilted angle or formed vertically at a 90 degree angle to the sample's surface. According to some embodiments, a region of the sample containing the two or more holes can be imaged at an angle normal to the surface of the sample with a scanning electron microscope and then milled along a diagonal cut with a focused ion beam. After the diagonal milling, a second image of the region can be taken at the same normal angle and the two images compared to determine if the center-to-center distance of the adjunct holes varies with depth.

If the holes are etched perfectly vertically (i.e., at a 90 degree angle with respect to the surface of the substrate), the center-to-center distance between adjacent holes will remain constant throughout the milled depth. If, on the other hand, such a process detects a difference in the center-to-center distances of holes etched at the surface of the substrate as compared to at the milled depth, the holes were etched at a tilted, non-vertical angle (i.e., and angle other than 90 degrees) and some embodiments can determine the actual angle that the tilted holes were etched at.

In some embodiments a method of evaluating a region of a sample that includes a plurality of holes is provided and the method can include: taking a first image of the region of the sample that includes the plurality of holes by scanning the region with a first charged particle beam; evaluating the first image to determine a first center-to-center distance between first and second holes in the plurality of holes; milling a diagonal cut in an area within the region that includes the second hole at an angle such that an upper surface of the sample in the milled area where the second hole is located is recessed with respect to an upper surface of the sample where the first hole is located; thereafter, taking a second image of the region of the sample that includes the first and second holes by scanning the region with the first charged particle beam; evaluating the second image to determine a second center-to-center distance between first and second holes in the plurality of holes; and comparing the second center-to-center distance to the first center-to-center distance.

In some embodiments a system is provided for evaluating a sample such as that described above. The system can include a vacuum chamber; a sample support configured to hold a sample within the vacuum chamber during a sample evaluation process; a scanning electron microscope (SEM) column configured to direct a first charged particle beam into the vacuum chamber; a focused ion beam (FIB) column configured to direct a second charged particle beam into the vacuum chamber; a processor and a memory coupled to the processor. The memory can include a plurality of computer-readable instructions that, when executed by the processor, cause the system to: take a first image of the region of the sample that includes the plurality of holes by scanning the region with a first charged particle beam; evaluate the first image to determine a first center-to-center distance between first and second holes in the plurality of holes; mill a diagonal cut in an area within the region that includes the second hole at an angle such that an upper surface of the sample in the milled area where the second hole is located is recessed with respect to an upper surface of the sample where the first hole is located; thereafter, take a second image of the region of the sample that includes the first and second holes by scanning the region with the first charged particle beam; evaluate the second image to determine a second center-to-center distance between first and second holes in the plurality of holes; and compare the second center-to-center distance to the first center-to-center distance.

Still additional embodiments pertain to a non-transitory computer-readable memory that stores instructions for evaluating a region of a sample, such as the sample described above, by: taking a first image of the region of the sample that includes the plurality of holes by scanning the region with a first charged particle beam; evaluating the first image to determine a first center-to-center distance between first and second holes in the plurality of holes; milling a diagonal cut in an area within the region that includes the second hole at an angle such that an upper surface of the sample in the milled area where the second hole is located is recessed with respect to an upper surface of the sample where the first hole is located; thereafter, taking a second image of the region of the sample that includes the first and second holes by scanning the region with the first charged particle beam; evaluating the second image to determine a second center-to-center distance between first and second holes in the plurality of holes; and comparing the second center-to-center distance to the first center-to-center distance.

Various implementations of the embodiments described herein can include one or more of the following features. The method can further include determining an angle β at which the holes are tilted. The method can further include rejecting the sample from a manufacturing line if the angle β is greater than a predetermined value. The first hole can be outside the area of the region milled at an angle. The sample can be positioned within in a vacuum chamber of an evaluation tool that includes a scanning electron microscope (SEM) column and a focused ion beam (FIB) column and the first and second images can be captured with the SEM column and the milling can be performed with the FIB column. The sample can be a semiconductor wafer.

In some implementations the angle β at which the holes are tilted can be determined according to the following formula:

$$\tan\beta = \tan\alpha\left(\frac{x}{\Delta x} + \cos\theta\right)$$

where α is the angle of diagonal cut, x is the center-to-center distance between the first and second holes as measured in the first image, and Δx is the difference in the exact positions of the second tilted hole before and after the diagonal cut and θ is the angle between a first imaginary line bisecting centers of the first and second holes in the first image and a second imaginary line bisecting a center of the second hole as initially imaged and the center of the second hole in the second image.

In some implementations the plurality of holes can be etched at an angle tilted in a first horizontal plane, the sample can be milled in the first horizontal plane and the angle β at which the holes are tilted can be determined according to the following formula:

$$\tan\beta = \tan\alpha\left(1 + \frac{x}{\Delta x}\right)$$

where α is the angle of diagonal cut, x is the center-to-center distance between the first and second holes as measured in the first image, and Δx is the difference in the center-to-center measurements of the second image and the first image.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments of the disclosure pertain to methods and systems for detecting tilted holes formed in a sample, such as a semiconductor wafer. Embodiments can evaluate a sample, that includes two or more holes (e.g., holes from an array of thousands or millions of equally spaced holes intended to have the same profile) etched into the sample and determine whether the holes are etched into the sample at a 90 degree angle to the sample's surface or whether the holes were etched into the sample at a non-vertical, tilted angle. According to some embodiments, a region of the sample containing the two or more holes can be imaged at an angle normal to the surface of the sample with a scanning electron microscope and then milled along a diagonal cut with a focused ion beam. After the diagonal milling, a second image of the region can be taken at the same normal angle and the two images compared to determine if the center-to-center distance of the holes varies with depth.

If the holes are etched vertically (i.e., at a 90 degrees angle with respect to the surface of the substrate), the center-to-center distance between adjacent holes will remain constant throughout the milled depth. If, on the other hand, such a process detects a difference in the center-to-center distances of holes etched at the surface of the substrate as compared to at the milled depth, the holes were etched at a tilted, non-vertical angle (i.e., and angle other than 90 degrees) and some embodiments can determine the actual angle that the tilted holes were etched at.

Example Sample Evaluation System

Figure 1A:
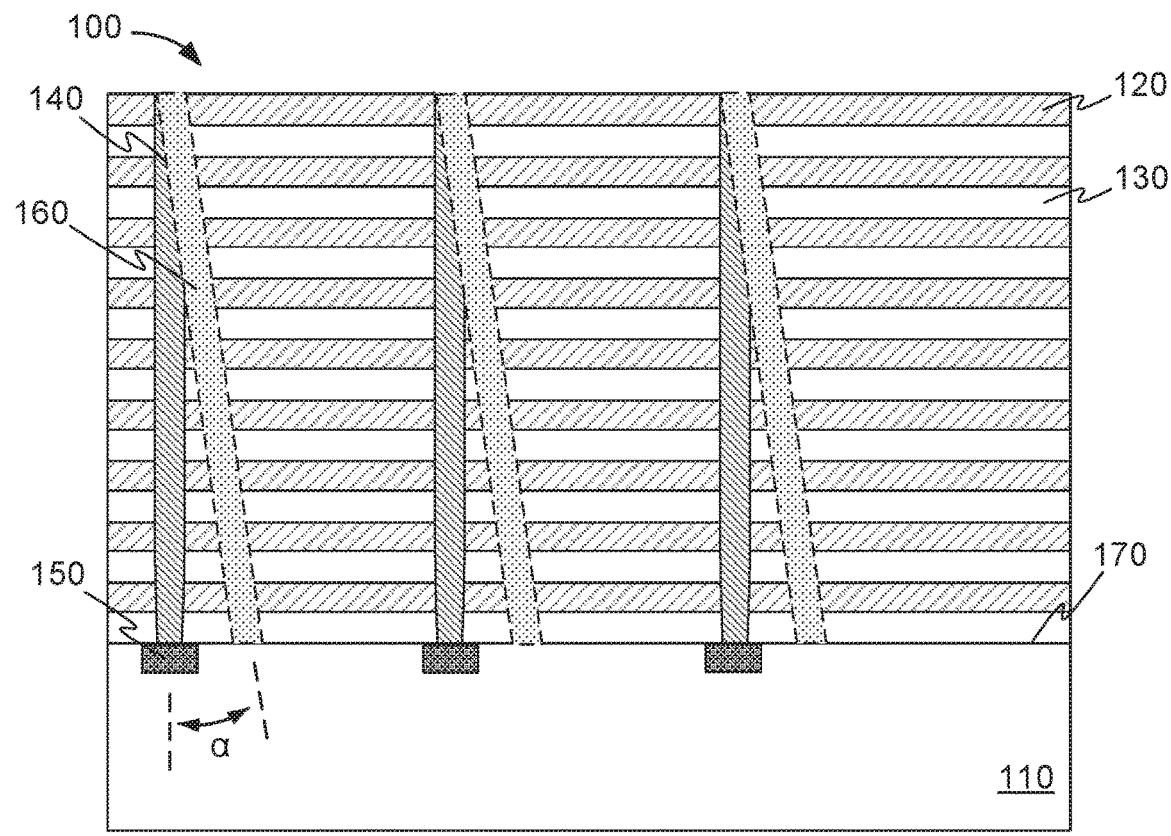
FIG. 1A is a simplified cross-sectional illustration of a sample having a hole formed through a portion of the sample at a tilted angle.
Figure 1B:
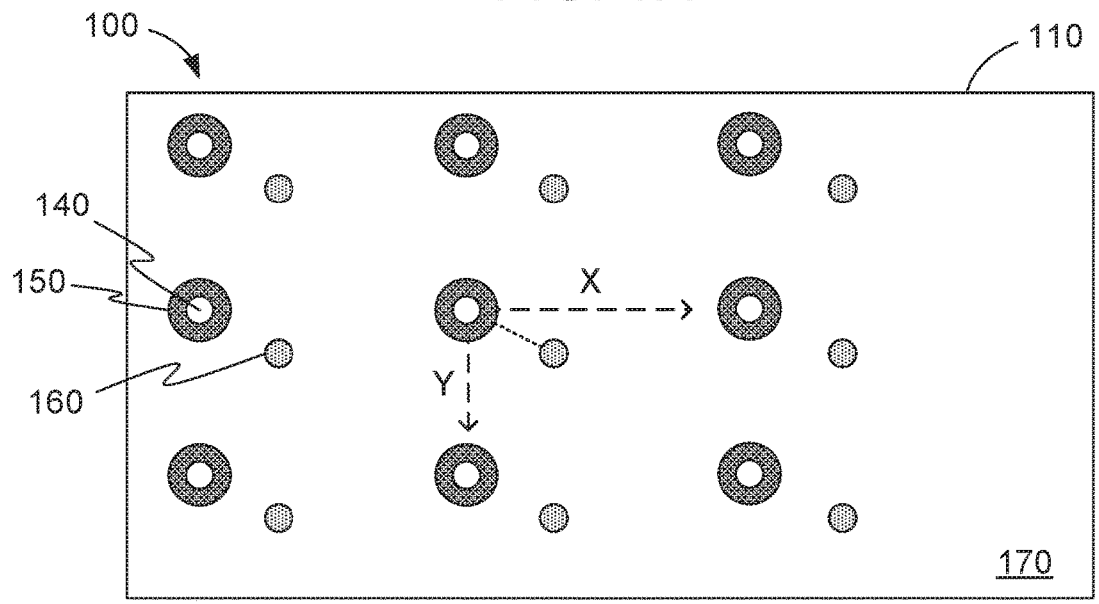
FIG. 1B is a simplified illustration of a surface of the sample depicted in FIG. 1A depicting a hole that is misaligned in both the X and the Y directions with a feature formed at the surface of the sample.
Figure 2:
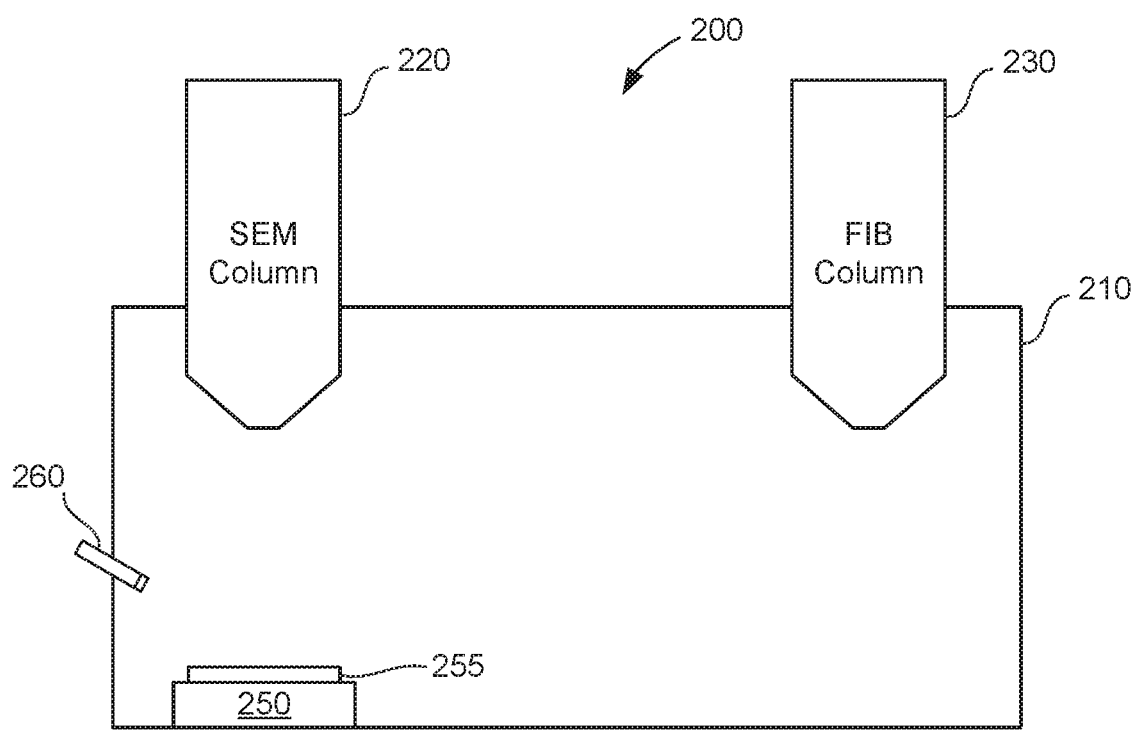
FIG. 2 is simplified illustration of a sample evaluation system according to some embodiments of the disclosure.

In order to better understand and appreciate the disclosure, reference is first made to FIG. 2, which is a simplified schematic illustration of an evaluation system suitable for detecting tilted holes in accordance with embodiments of the disclosure. Sample evaluation system 200 can be used for, among other operations, defect review and analysis of structures formed on semiconductor wafers.

System 200 can include a vacuum chamber 210 along with a scanning electron microscope (SEM) column 220 and a focused ion beam (FIB) column 230. A supporting element 250 (e.g., a sample support pedestal) can support a sample 255 (e.g., a semiconductor wafer) within chamber 210 during a processing operation in which the sample 255 (sometimes referred to herein as an "object" or a "specimen") is subject to a charged particle beam from one of the FIB or SEM columns. Supporting element 250 can also move the sample within vacuum chamber 210 between the field of view of the two columns 220 and 230 as required for processing.

One or more gases can be delivered to a sample being processed by a gas supply unit 260 for certain operations. For simplicity of explanation gas supply unit 260 is illustrated in FIG. 2 as a nozzle, but it is noted that gas supply unit 260 can include gas reservoirs, gas sources, valves, one or more inlets and one or more outlets, among other elements. In some embodiments gas supply unit 260 can be configured to deliver gas to a sample in the area of the sample that is exposed to the scan pattern of the charged particle beam as opposed to delivering gas to an entire upper surface of the sample. For example, in some embodiments gas supply unit 260 has a nozzle diameter measured in hundreds of microns (e.g., between 400-500 microns) that is configured to deliver gas directly to a relatively small portion of the sample's surface that encompasses the charged particle beam scan pattern. In various embodiments, a first gas supply unit 260 can be configured to deliver gas to a sample disposed under SEM column 220 and a second gas supply unit 260 can be configured to deliver gas to a sample disposed under FIB column 230.

SEM column 220 and FIB column 230 are connected to vacuum chamber 210 so that a charged particle beam generated by either one of the charged particle columns propagates through a vacuumed environment formed within vacuum chamber 210 before impinging on sample 255. SEM column 220 can generate an image of a portion of sample 255 by illuminating the sample with a charged particle beam, detecting particles emitted due to the illumination and generating charged particle images based on the detected particles. FIB column 230 can mill (e.g., drill a hole in) sample 255 by irradiating the sample with one or more charged particle beams to form a cross section and can also smooth the cross section. The cross section can include one or more first portions of a first material and one or more second portions of a second material. The cross section can also include additional portions of other materials. Conveniently, the smoothing operation typically involves utilizing smaller acceleration voltages in relation to the milling of the sample.

The particle imaging and milling processes each typically include scanning a charged particle beam back-and-forth (e.g., in a raster scan pattern) at a constant rate across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns.

In some embodiments, in order to evaluate a sample 255 that includes two or more holes etched into the sample, the sample can be milled along a diagonal cut with the FIB column 230 and then imaged in a top-down mode (i.e., at an angle normal to the surface of sample 255) with SEM column 220. Such a process can detect a difference in the center-to-center distances of holes etched at an angle that would not be present if the holes were etched vertically at 90 degrees. Further details of detecting tilted holes using such techniques are described below with respect to FIGS. 3-8.

While not shown in either of FIG. 2, system 200 can include one or more controllers, processors or other hardware units that control the operation of system 200 by executing computer instructions stored in one or more computer-readable memories as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Milling a Sample Along a Diagonal Cut

As mentioned above, embodiments set forth in the disclosure can be used to evaluate a sample, such as sample 255, that includes two or more holes etched into the sample. The sample can be milled along a diagonal cut with a focused ion beam and then imaged at an angle normal to the surface of the sample with a scanning electron microscope beam. Such a process can detect whether a difference in the center-to-center distances of holes exits from the surface of the substrate as compared to a deeper portion of the substrate. If the holes are etched perfectly vertical (i.e., at a 90 degrees angle with respect to the surface of the substrate), the center-to-center distance between adjacent holes will remain constant throughout the milled depth. If, on the other hand, such a process detects a difference in the center-to-center distances of holes etched at the surface of the substrate as compared to at the milled depth, embodiments can determine that the holes were etched at a non-vertical angle (i.e., and angle other than 90 degrees) and can determine the actual angle the holes were etched at.

Figure 3:
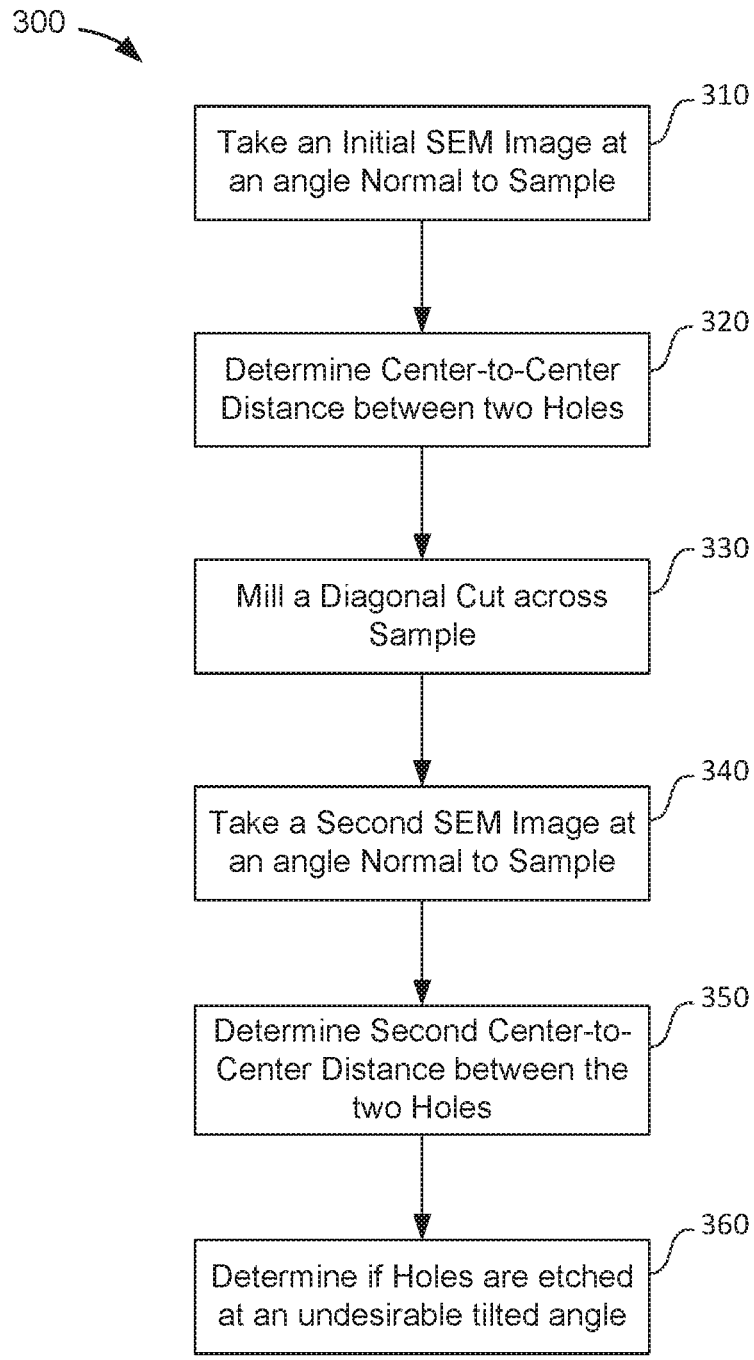
FIG. 3 is a flowchart depicting steps associated with a method of evaluating a sample according to some embodiments of the disclosure.
Figure 4A:
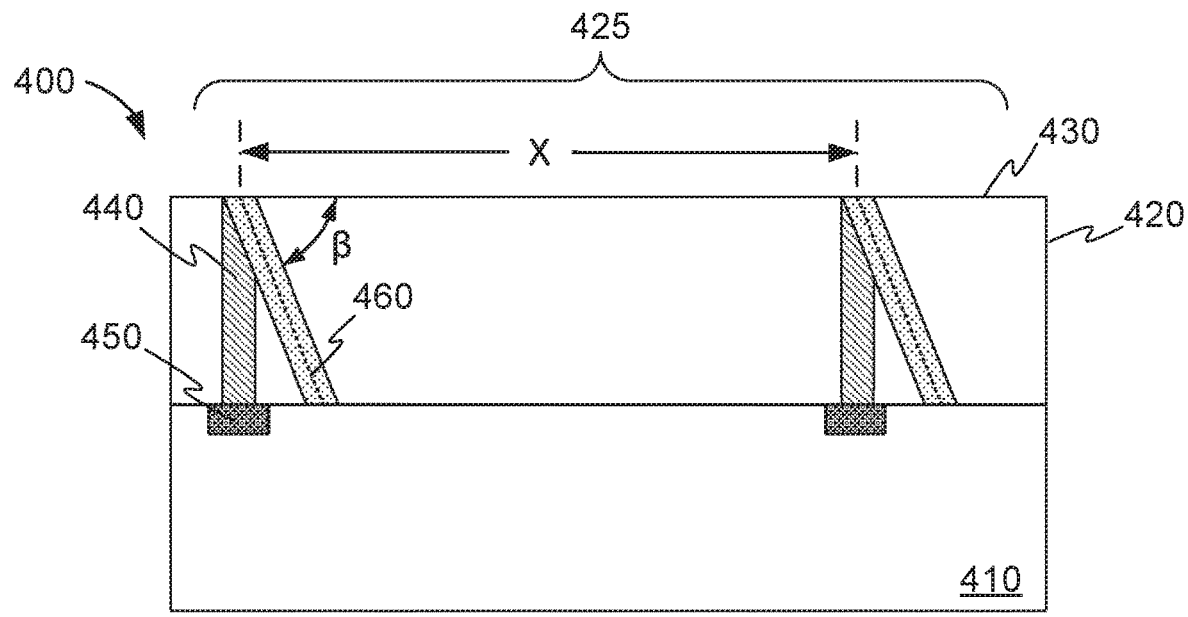
FIG. 4A is a simplified cross-sectional view of a semiconductor wafer having multiple holes etched therein.
Figure 4B:
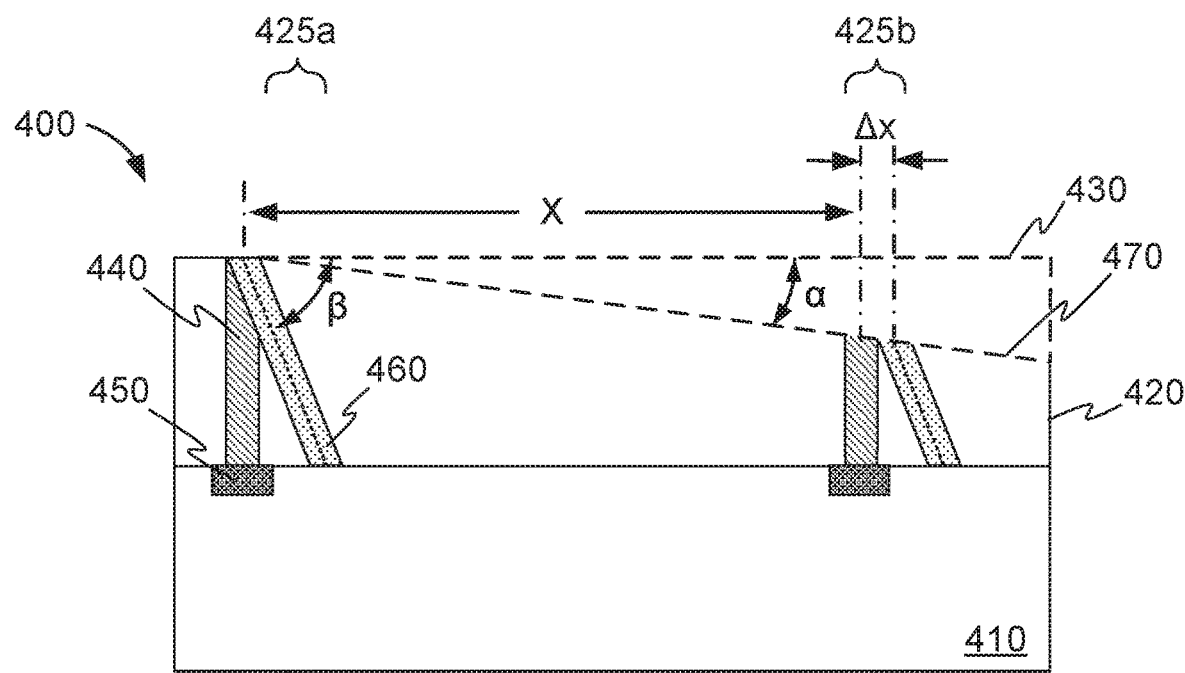
FIG. 4B is a simplified cross-sectional view of the semiconductor wafer shown in FIG. 4A after a diagonal cut has been made in a region that can be evaluated according to some embodiments disclosed herein.

To illustrate, reference is made to FIG. 3, which is a flowchart illustrating steps associated with a method 300 according some embodiments of the disclosure, and to FIGS. 4A and 4B, which are a simplified cross-sectional views of a semiconductor wafer 400 subjected to the steps of method 400. Semiconductor wafer 400 can include multiple holes, such as an array of thousands or millions of small feature size, high aspect ratio holes, formed through one of more layers 420 formed over a semiconductor substrate 410 in a region 425 that can be evaluated according to embodiments of the disclosure. For illustrative purposes only, semiconductor wafer 400 is shown as having two vertically etched holes 440 and two holes 460 etched at an angle that results in a non-vertical "tilted") hole. The inclusion of both holes 440 and 460 shown in overlapping regions is for explanatory purposes only. A person of ordinary skill in the art will appreciate that semiconductor wafer 400 will actually include only one of the set of holes 440 or the set of holes 460 in the area 425 that can be evaluated in accordance with the methods disclosed herein. To further simplify the discussion below, at times the holes etched into semiconductor wafer 400 are referred to collectively below as "holes 440, 460". Since the semiconductor wafer 400 only includes one set of the holes 440 or one set of the holes 460, such a description is understood to refer to whichever set of holes a given sample wafer 400 actually includes: holes 440 or holes 460. Embodiments described in this disclosure teach a method of determining whether the semiconductor wafer 400 includes vertically oriented holes, such as holes 440, or angled holes, such as holes 460.

Also shown in FIGS. 4A and 4B are structures 450 formed at a depth within the semiconductor wafer 400 that the holes 440, 460 are intended to be formed directly over. As one non-limiting example, holes 440 can be vias formed through one or more layers 420 of dielectric material and structures 450 can be a portion of a memory cell or similar electronic device formed on substrate 410. Structures 450 need not be present in all samples and embodiments described in the disclosure can detect whether holes 440, 460 are formed vertically or tilted irrespective of whether structures, such as structures 450, is formed beneath the holes.

An initial step of method 300 can include moving the wafer 400 under the field-of-view of a scanning electron microscope, such as the SEM column 220 shown in FIG. 2, and taking an initial image of wafer in the region that includes an array of holes 440, 460 (block 310) using a top-down mode in which the SEM beam is normal to the surface 430 of wafer 400. The initial image can be evaluated to determine the center-to-center distance between a pair of holes in the array using, for example, known image analysis techniques (block 320). In some embodiments, the pair of holes for which the center-to-center distance is determined can be adjacent holes as illustrated in FIGS. 4A and 4B. In other embodiments, however, the holes need not be adjacent and can be separated by multiple other holes. As simplistic, non-limiting examples, in an array of holes having 5 columns of 100 holes (i.e., 100 rows), block 320 could determine the center-to-center distance between a first hole at column 1, row 10 and a second hole at column 1, row 40. Alternatively, block 320 could determine the center-to-center distance between a first hole at column 1, row 10 and a second hole at column 5, row 10. As can be appreciated by a person of ordinary skill in the art, any two holes in the array could be chosen when determining the center-to-center distance in block 320 provided holes having the same expected spacing between them are chosen for comparison purposes in the later steps of method 300.

Next, the semiconductor wafer 400 can be moved under the field-of-view of a focused ion beam column, such as FIB column 230 shown in FIG. 3, and the region that includes the imaged holes can be milled with a diagonal cut 470 (block 330). As shown in FIG. 4B, diagonal cut 470 can be made at an angle α such that the cut 470 starts in a region 425a spaced slightly away from where a first of the holes 440, 460 is etched and becomes deeper as the cut is extended into a region 425b where a second of the holes 440, 460 is etched.

After diagonal cut 470 is made, the semiconductor wafer 400 can be moved back under the field-of-view of the SEM column and a second image of the wafer in region 425 can be taken that includes the same holes imaged in block 310 (block 340) using the same top-down mode in which the SEM beam is normal to the surface 430 of wafer 400 as used for the first image. The second image can be evaluated to determine the center-to-center distance, at the surface defined by diagonal cut 470, between the same two holes for which the center-to-center distance was determined in block 320 using, for example, known the same image analysis techniques used to determine the center-to-center distance of the holes in the first image (block 350).

Next, the second center-to-center distance (determined in block 350) can be compared to the first center-to-center distance (determined in block 320) to determine if there is a difference between the two measurements and evaluate whether the holes are etched at an undesirable tilted angle (block 360). For example, as shown in FIG. 4B, if the holes formed in wafer 400 are tilted holes 460, the center-to-center distance between the holes will increase with along the diagonal cut. Thus, the two measurements will differ from each other by a difference of Δx. If, on the other hand, the center-to-center distance does not change along diagonal cut (i.e., Δx=0), the holes formed in wafer 400 are vertical holes etched into the wafer at a 90 degrees angle to surface 430. As can be appreciated, diagonal cuts at higher angles will result in a deeper cut in area 425b and a larger Δx to be seen for a given tilted angle β of holes 460.

In addition to determining whether the holes etched in sample 400 are vertical holes 440 or tilted holes 460, in some embodiments the actual angle β of the holes can be calculated. As stated previously, if the there is no difference in the center-to-center distance as measured between blocks 320 and 350, in some instances it can be assumed that the holes are vertical, such as holes 440. If, on the other hand, there is a difference between the center-to-center distances as measured in blocks 320 and 350, it can be concluded that the holes are tilted, such as holes 460 and some embodiments can calculate the precise angle β of tilt for the holes (e.g., in block 360) using one of the techniques described below.

On-Axis Hole Tilt Angle Measurements

Figure 5:
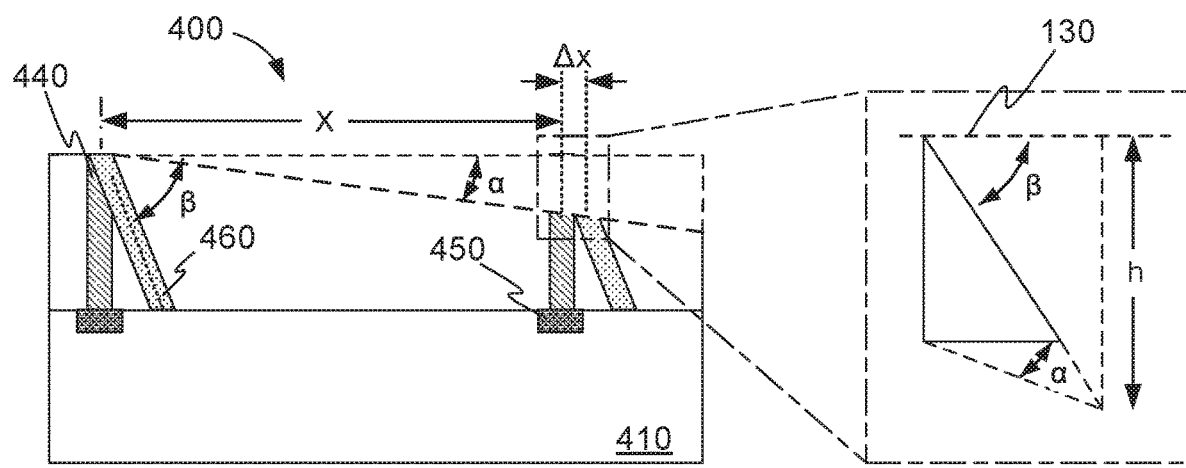
FIG. 5 is a simplified cross-sectional view of the semiconductor wafer shown in FIG. 4B along with a mathematical representation of the region being evaluated according to some embodiments.

For example, some embodiments block 330 can include additional sub-steps to determine if the holes 440, 460 were etched at a tilted angle and the direction of the tilt prior to milling the diagonal cut 470. For example, in some embodiments block 330 can include making an initial diagonal cut to determine if the center-to-center distances between the holes pre-cut and after the cut changes, and if the distance does change, use imaging techniques to determine the direction that the holes 460 are tilted. Once the direction is determined, a second diagonal cut (i.e., diagonal cut 470) can be formed in the region being evaluated in the direction of the tilt. Then, such embodiments can calculate the angle β that the tilted holes 460 were etched at using the following formula:

$$\left.\begin{array}{l}\tan\beta = \dfrac{h}{\Delta x}\\ \tan\alpha = \dfrac{h}{x + \Delta x}\end{array}\right\} \rightarrow \tan\beta = \dfrac{(x + \Delta x)\tan\alpha}{\Delta x} \quad (1)$$

where β is the angle at which the holes are tilted, α is the angle of diagonal cut 470 (which is known and which is in the same horizontal plane as angle β), x is the center-to-center distance between the first and second holes as measured in block 320, βx is the difference in the center-to-center measurements between blocks 320 and 350 as determined in block 360, and h is the distance between the milled depth at which the second hole is imaged in block 360 compared to the depth at which it was imaged in block 320. FIG. 5 is a simplified cross-sectional view of the semiconductor wafer shown in FIG. 4B along with a mathematical representation of the region being evaluated according to some embodiments and formula (1) above.

Formula (1) can be simplified to the following:

$$\tan\beta = \tan\alpha\left(1 + \frac{x}{\Delta x}\right) \quad (2)$$

Figure 6:
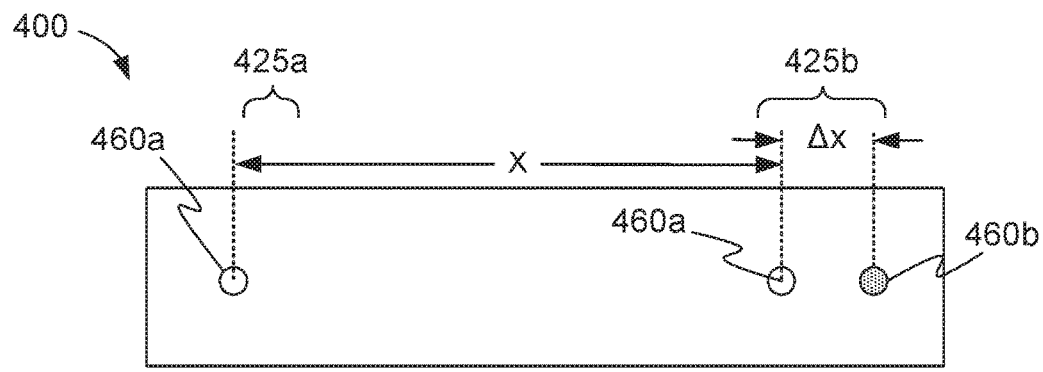
FIG. 6 is a simplified illustration depicting the evaluation of a sample in accordance with some embodiments.

The distance βx is depicted in the simplified illustration of FIG. 6 with respect to two tilted holes 460. As shown in FIG. 6, the center-to-center distance between a pair of tilted holes 460 (a first hole adjacent to region 425a and a second hole in region 425b) measured from a first image taken prior to a milling operation (e.g., as measured in block 320 from a first image of wafer 400) is shown as the distance x between the centers 460a of the two holes in the first image. FIG. 6 also shows the center 460b of the hole in region 425b as represented in a second image (e.g., as taken in block 340) from of wafer 400 after the wafer is milled along diagonal cut 470) where the center of the tilted hole 460 in region 425b has shifted (due to the depth at which the second image was taken and the angle of the tilted hole) from hole center 460a to hole center 460b.

Once the angle of tilt is calculated, it can be used (e.g., by the manufacturer that is fabricating electronic devices on semiconductor wafer 400) to determine whether or not the tilt angle is within acceptable manufacturing tolerances or whether to reject wafer 400.

Off-Axis Hole Tilt Angle Measurements

Figure 7A:
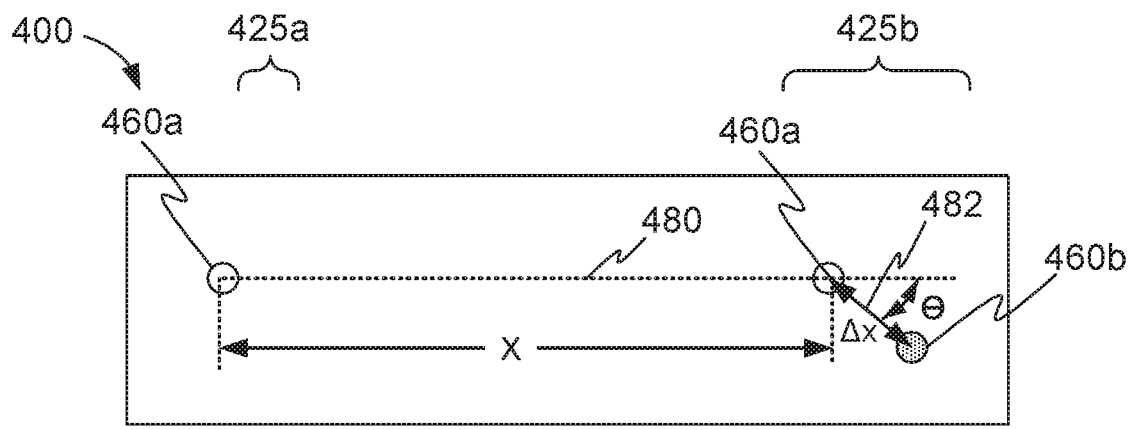
FIGS. 7A and 7B are simplified illustrations depicting the evaluation of a sample in accordance with some embodiments.

In other embodiments, the angles α and β do not need to be in the same direction and thus do not include additional sub-steps, such as those described above in conjunction with block 330. For example, FIG. 7A is a simplified illustration depicting a change in position of a hole in region 425b when comparing a first image of a pair of tilted holes 460 (e.g., as measured in block 320 and shown by the distance x between the two hole centers 460a) to a second image of the tilted holes 460 (e.g., where the center of the hole in region 425b has shifted to hole center 460b in a second image taken during block 340) when the diagonal cut 470 is not in the same horizontal plane as a tilted hole 460. Instead, the direction of diagonal cut 470 and the direction of the tilted holes can differ by an unknown angle.

Such embodiments can still calculate the angle β that the tilted holes 460 were etched at using the following formula:

$$\left.\begin{array}{l}\tan\beta = \dfrac{h}{\Delta x} \\ \tan\alpha = \dfrac{h}{x+d} \\ d = \Delta x \cdot \cos\theta\end{array}\right\} \to \tan\beta = \dfrac{(x+d)\tan\alpha}{\Delta x} \quad (3)$$

where β is the angle at which the holes are tilted, α is the angle of diagonal cut 470 (which is known but which is off axis from the direction of angle β), x is the center-to-center distance between the first and second holes as measured in a first, pre-milled image, βx is the difference in the exact positions of the tilted hole before and after the diagonal cut, h is the distance between the milled depth at which the second hole is imaged in a second, post-milled image compared to the depth at which it was imaged in the first image, and θ is the angle between a first imaginary line 480 bisecting the hole centers 460a of the two holes 460 as initially imaged and a second imaginary line 482 bisecting the hole center 460a of the hole in region 425b as initially imaged and hole center 460b of the hole in region 425b from the second image as shown in FIG. 7A.

Formula (3) can be simplified to:

$$\tan\beta = \tan\alpha\left(\frac{x + \Delta x \cdot \cos\theta}{\Delta x}\right) \quad (4)$$

And, formula (4) can be simplified to:

$$\tan\beta = \tan\alpha\left(\frac{x}{\Delta x} + \cos\theta\right) \quad (5)$$

Once the angle of tilt is calculated, it can be used (e.g., by the manufacturer that is fabricating electronic devices on semiconductor wafer 400) to determine whether or not the tilt angle is within acceptable manufacturing tolerances or whether to reject wafer 400.

In some instances, there is a possibility that the center-to-center distance between the holes in the first and second images will not change even though the holes were etched at an undesirable, tilted angle. That is, given a specific combination of the angle θ and the shift Δx, the center-to-center distance might not change. To illustrate, reference is made to FIG. 7B, which is a simplified illustration depicting a change in position of a hole between pre-milled and post-milled images of a pair of tilted holes 460 when the diagonal cut 470 is not in the same horizontal plane as a tilted hole 460 and where the center-to-center distances between the holes in each image is the same.

Figure 7B:
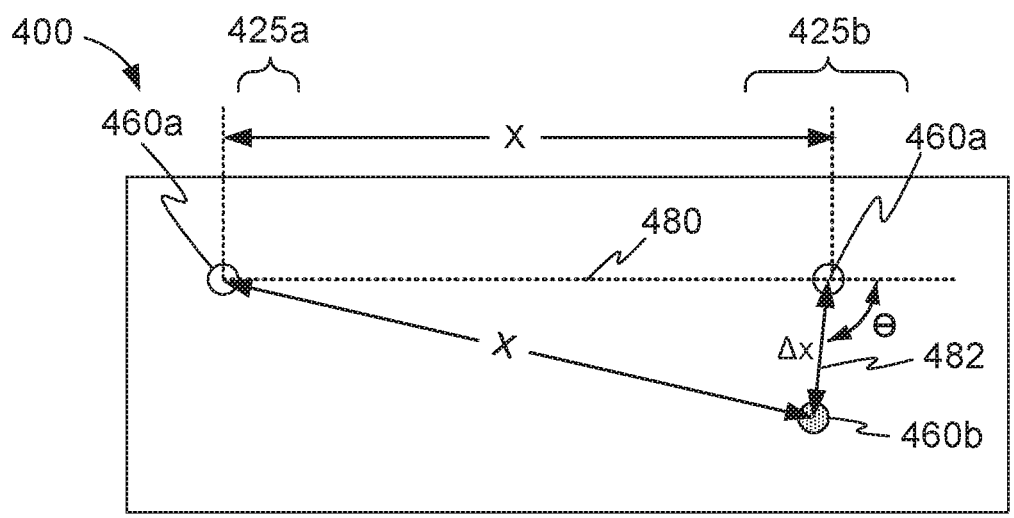

As shown in FIG. 7B, prior to being milled diagonally as discussed herein, a pair of tilted holes 460 are spaced apart by a distance X (e.g., as shown by the distance X between the hole centers 460a of each hole). After the diagonal milling process the center of the tilted hole in region 425b moves from position 460a to position 460b. While position 460b is spaced apart from position 460a by a distance 4x, the hole in region 425b is actually the same distance X away from the hole adjacent to region 425a. Thus, some embodiments can determine that holes are etched at a tilted angle (block 360) if either the center-to-center distance between the holes changes or the direction (azimuth) between the holes changes. Said differently, embodiments can determine that holes are etched vertically if both the center-to-center distance between the holes and the direction (azimuth) between the holes remains unchanged.

Example of a Sample Having a Plurality of Holes

Figure 8:
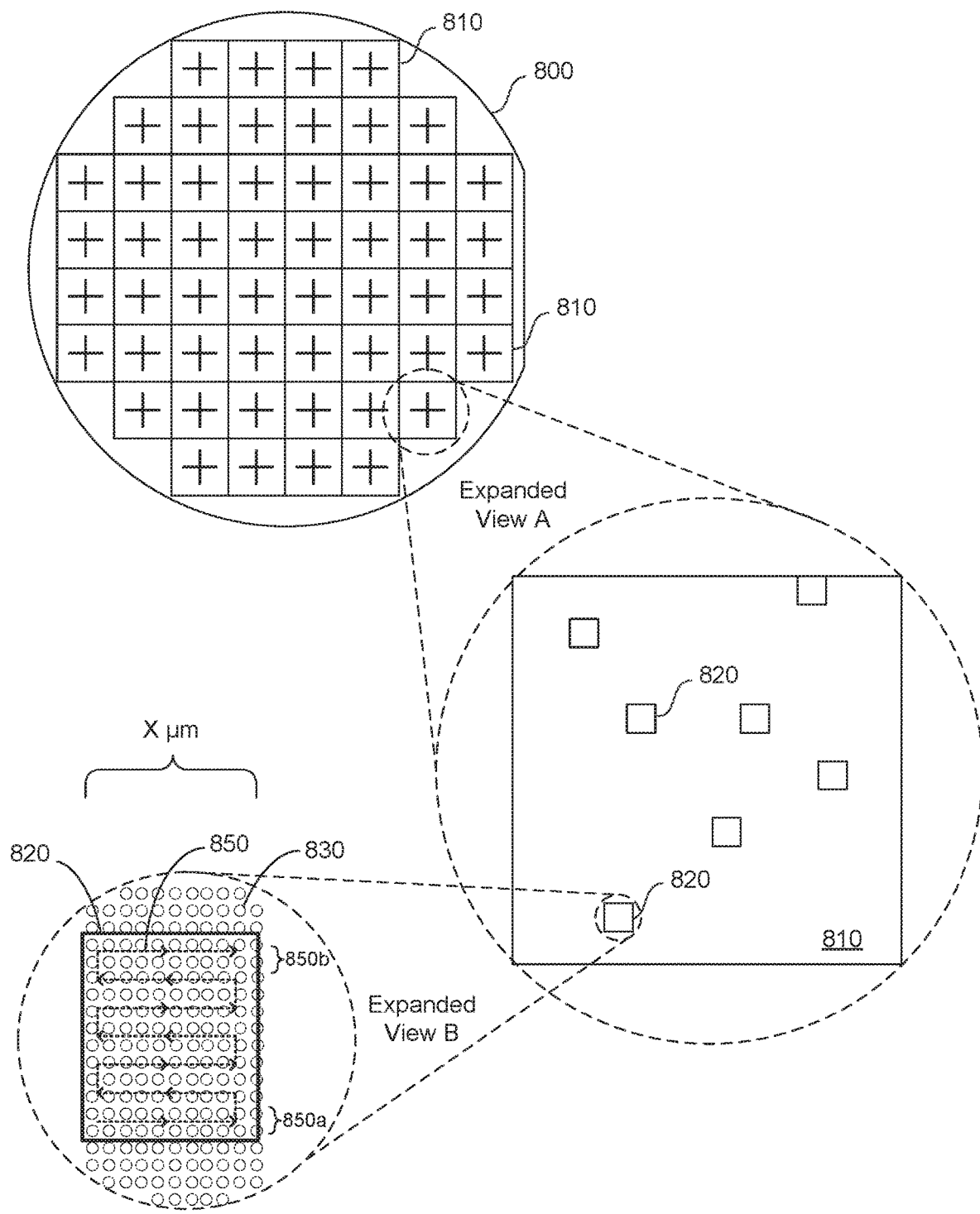
FIG. 8 is a simplified illustration of an area on a semiconductor wafer that can include holes that can be evaluated to determine if the holes were etched at a tilted angle according to some embodiments.

In order to provide context to some aspects of the embodiments set forth in the disclosure, reference is made to FIG. 8, which is a simplified illustration of an area on a semiconductor wafer that can include adjacent holes that can be evaluated to determine if the holes were etched at a tilted angle according to some embodiments. Specifically, FIG. 8 includes a top view of wafer 800 along with two expanded views of specific portions of wafer 800. Wafer 800 can be, for example, a 200 mm or 300 mm semiconductor wafer and can include multiple integrated circuits 810 (fifty two in the example depicted) formed thereon. The integrated circuits 810 can be at an intermediate stage of fabrication and the delayering techniques described herein can be used to evaluate and analyze one or more regions 820 of the integrated circuits. For example, Expanded View A of FIG. 8 depicts multiple regions 820 of one of the integrated circuits 810 that can be evaluated and analyzed according to the techniques described herein. Expanded View B depicts one of those regions 820 that includes an array 830 of holes formed therein.

Embodiments of the disclosure can analyze and evaluate the holes in region 820 by capturing a first SEM image of area 820, milling the region 820 along a diagonal cut as discussed above and then taking a second SEM image of area 820. The SEM images can, for example, be done by scanning the SEM beam back and forth within the region according to a raster pattern, such as scan pattern 850 depicted in a simplified format in the Expanded View B of FIG. 8. The milling process can mill region 820 by scanning the FIB beam back and forth within the region according to a similar raster pattern where the beam is scanned line-by-line from a beginning portion 850a to an ending portion 850b where each scan line is milled a little longer than the previous scan line such that the milled region 820 has an angle where the depth of the milled region is deeper in the ending portion 850b than the beginning portion 850a.

Any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

The foregoing description, for purposes of explanation, used specific nomenclature to provide a thorough understanding of the described embodiments. However, it will be apparent to one skilled in the art that the specific details are not required in order to practice the described embodiments. For example, while several specific embodiments of the disclosure described above use an example semiconductor wafer as the sample, embodiments of the disclosure can be employed to delayer other types of samples including nanostructures formed on substrates other than a semiconductor wafer. Thus, the foregoing descriptions of the specific embodiments described herein are presented for purposes of illustration and description. They are not target to be exhaustive or to limit the embodiments to the precise forms disclosed. Also, while different embodiments of the disclosure were disclosed above, the specific details of particular embodiments may be combined in any suitable manner without departing from the spirit and scope of embodiments of the disclosure.

Further, it will be apparent to one of ordinary skill in the art that many modifications and variations are possible in view of the above teachings. For example, while FIG. 3 depicted a specific order of steps according to some embodiments, the order can be varied in other embodiments. As one particular example, in some embodiments the center-to-center distances between adjacent holes in the first and second images can be determined at any appropriate time after the first and second images are captured. As another example, in some embodiments, a single image can be used to determine the center-to-center distances of the holes in both block 320 and block 350. For example, often holes formed in a sample are part of a large array of holes having the same spacing. A single image taken in block 340 can capture both holes in the region that is milled and holes outside the milled region that are in the same array of holes as those within the region. Since the spacing of the holes in the array is consistent, in some embodiments block 360 can compare the center-to-center distance of holes within the region milled in block 330 to the center-to-center distance of holes outside the milled region.

Because the illustrated embodiments of the present disclosure may for the most part, be implemented using electronic components and circuits known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

What is claimed is:

1. A method of evaluating a region of a sample that includes a plurality of holes, the method comprising:
    taking a first image of the region of the sample that includes the plurality of holes by scanning the region with a first charged particle beam;
    evaluating the first image to determine a first center-to-center distance between first and second holes in the plurality of holes;
    milling a diagonal cut in an area within the region that includes the second hole at an angle such that an upper surface of the sample in the milled area where the second hole is located is recessed with respect to an upper surface of the sample where the first hole is located;
    thereafter, taking a second image of the region of the sample that includes the first and second holes by scanning the region with the first charged particle beam;
    evaluating the second image to determine a second center-to-center distance between first and second holes in the plurality of holes; and
    comparing the second center-to-center distance to the first center-to-center distance.

2. The method of claim 1 further comprising determining an angle θ at which the holes are tilted.

3. The method of claim 2 further comprising rejecting the sample from a manufacturing line if the angle θ is greater than a predetermined value.

4. The method of claim 1 further comprising determining an angle β at which the holes are tilted according to the following formula:

$$\tan\beta = \tan\alpha\left(\frac{x}{\Delta x} + \cos\theta\right)$$

where α is the angle of diagonal cut, x is the center-to-center distance between the first and second holes as measured in the first image, and βx is a difference in the exact positions of the second hole before and after the diagonal cut and θ is the angle between a first imaginary line bisecting centers of the first and second holes in the first image and a second imaginary line bisecting a center of the second hole as initially imaged and the center of the second hole in the second image.

5. The method of claim 1 wherein the first hole is outside the area of the region milled at an angle.

6. The method of claim 1 wherein the plurality of holes are etched at an angle tilted in a first horizontal plane and the sample is milled in the first horizontal plane.

7. The method of claim 6 further comprising determining an angle β at which the holes are tilted at which the plurality of holes are tilted according to the following formula:

$$\tan\beta = \tan\alpha\left(1 + \frac{x}{\Delta x}\right)$$

where α is the angle of diagonal cut, x is the center-to-center distance between the first and second holes as measured in the first image, and βx is a difference in the center-to-center measurements of the second image and the first image.

8. The method of claim 1 wherein the sample is positioned within in a vacuum chamber of an evaluation tool that includes a scanning electron microscope (SEM) column and a focused ion beam (FIB) column and the first and second images are taken with the SEM column and the milling is performed with the FIB column.

9. The method of claim 8 wherein the sample is a semiconductor wafer.

10. A system for evaluating a region of a sample that includes a plurality of holes, the system comprising:
   a vacuum chamber;
   a sample support configured to hold a sample within the vacuum chamber during a sample evaluation process;
   a scanning electron microscope (SEM) column configured to direct a first charged particle beam into the vacuum chamber;
   a focused ion beam (FIB) column configured to direct a second charged particle beam into the vacuum chamber;
   a processor and a memory coupled to the processor, the memory including a plurality of computer-readable instructions that, when executed by the processor, cause the system to:
      take a first image of the region of the sample that includes the plurality of holes by scanning the region with a first charged particle beam;
      evaluate the first image to determine a first center-to-center distance between first and second holes in the plurality of holes;
      mill a diagonal cut in an area within the region that includes the second hole at an angle such that an upper surface of the sample in the milled area where the second hole is located is recessed with respect to an upper surface of the sample where the first hole is located;
      thereafter, take a second image of the region of the sample that includes the first and second holes by scanning the region with the first charged particle beam;
      evaluate the second image to determine a second center-to-center distance between first and second holes in the plurality of holes; and
      compare the second center-to-center distance to the first center-to-center distance.

11. The system for evaluating a sample set forth in claim 10 wherein the processor further causes the system to determine an angle θ at which the holes are tilted.

12. The system for evaluating a sample set forth in claim 10 wherein the first hole is outside the area of the region milled at an angle.

13. The system for evaluating a sample set forth in claim 10 wherein the processor further causes the system to determine an angle β at which the holes are tilted according to the following formula:

$$\tan\beta = \tan\alpha\left(\frac{x}{\Delta x} + \cos\theta\right)$$

where α is the angle of diagonal cut, x is the center-to-center distance between the first and second holes as measured in the first image, and βx is a difference in the exact positions of the second hole before and after the diagonal cut and θ is the angle between a first imaginary line bisecting centers of the first and second holes in the first image and a second imaginary line bisecting a center of the second hole as initially imaged and the center of the second hole in the second image.

14. The system for evaluating a sample set forth in claim 10 wherein the plurality of holes are etched at an angle tilted in a first horizontal plane and the processor further causes the system to mill the sample in the first horizontal plane.

15. The system for evaluating a sample set forth in claim 14 wherein the processor further causes the system to determine an angle β at which the holes are tilted at which the plurality of holes are tilted according to the following formula:

$$\tan\beta = \tan\alpha\left(1 + \frac{x}{\Delta x}\right)$$

where α is the angle of diagonal cut, x is the center-to-center distance between the first and second holes as measured in the first image, and βx is a difference in the center-to-center measurements of the second image and the first image.

16. A non-transitory computer-readable memory that stores instructions for evaluating a region of a sample that includes a plurality of holes by:
   taking a first image of the region of the sample that includes the plurality of holes by scanning the region with a first charged particle beam;
   evaluating the first image to determine a first center-to-center distance between first and second holes in the plurality of holes;
   milling a diagonal cut in an area within the region that includes the second hole at an angle such that an upper surface of the sample in the milled area where the second hole is located is recessed with respect to an upper surface of the sample where the first hole is located;
   thereafter, taking a second image of the region of the sample that includes the first and second holes by scanning the region with the first charged particle beam;
   evaluating the second image to determine a second center-to-center distance between first and second holes in the plurality of holes; and
   comparing the second center-to-center distance to the first center-to-center distance.

17. The non-transitory computer-readable memory set forth in claim 16 wherein the instructions for evaluating the region further include instructions to determine an angle β at which the holes are tilted.

18. The non-transitory computer-readable memory set forth in claim 16 wherein the first hole is outside the area of the region milled at an angle.

19. The non-transitory computer-readable memory set forth in claim 16 wherein the instructions for evaluating the region further include instructions to determine an angle β at which the holes are tilted according to the following formula:

$$\tan\beta = \tan\alpha\left(\frac{x}{\Delta x} + \cos\theta\right)$$

where α is the angle of diagonal cut, x is the center-to-center distance between the first and second holes as measured in the first image, and βx is a difference in the exact positions of the second hole before and after the diagonal cut and θ is the angle between a first imaginary line bisecting centers of the first and second holes in the first image and a second imaginary line bisecting a center of the second hole as initially imaged and the center of the second hole in the second image.

20. The non-transitory computer-readable memory set forth in claim 16 wherein the plurality of holes are etched at an angle tilted in a first horizontal plane and the instructions for evaluating the region further include instructions to determine an angle β at which the holes are tilted at which the plurality of holes are tilted according to the following formula:

$$\tan\beta = \tan\alpha\left(1 + \frac{x}{\Delta x}\right)$$

where α is the angle of diagonal cut, x is the center-to-center distance between the first and second holes as measured in the first image, and βx is a difference in the center-to-center measurements of the second image and the first image.

* * * * *